United States Patent [19]
Nance et al.

[11] Patent Number: 6,156,621
[45] Date of Patent: Dec. 5, 2000

[54] METHOD FOR FABRICATING DIRECT WAFER BOND SI/SIO₂/SI SUBSTRATES

[75] Inventors: Paul Nance; Ludwig Leipold; Wolfgang Werner, all of München, Germany

[73] Assignee: Infineon Technologies AG, Munich, Germany

[21] Appl. No.: 09/158,252

[22] Filed: Sep. 22, 1998

[30] Foreign Application Priority Data

Sep. 23, 1997 [DE] Germany ............ 197 41 971

[51] Int. Cl.⁷ ............................................. H01L 21/76
[52] U.S. Cl. ................... 438/406; 438/455; 438/459; 438/977
[58] Field of Search ........................ 438/406, 455, 438/459, 977

[56] References Cited

U.S. PATENT DOCUMENTS 5,081,061  1/1992  Rouse et al. ........................ 437/62
5,459,104  10/1995  Sakai .................................. 437/225
5,686,364  11/1997  Ohki et al. ........................ 438/406
5,773,352  6/1998  Hamajima ........................ 438/406

*Primary Examiner*—John F. Niebling
*Assistant Examiner*—David A. Zarneke
*Attorney, Agent, or Firm*—Herbert L. Lerner; Laurence A. Greenberg; Werner H. Stemer

[57] ABSTRACT

A method for fabricating direct wafer bond Si/SiO₂/Si substrates in which trenches are etched into a rear side of a device wafer. Subsequently, the rear side of the device wafer is ground. The device wafer is then placed by its front side onto the carrier wafer and the wafers are cross-linked to each other. The method has the advantage that a trench depth is no longer defined by an inaccurate etching process but rather by a thinning-back process that can be precisely controlled.

8 Claims, 1 Drawing Sheet

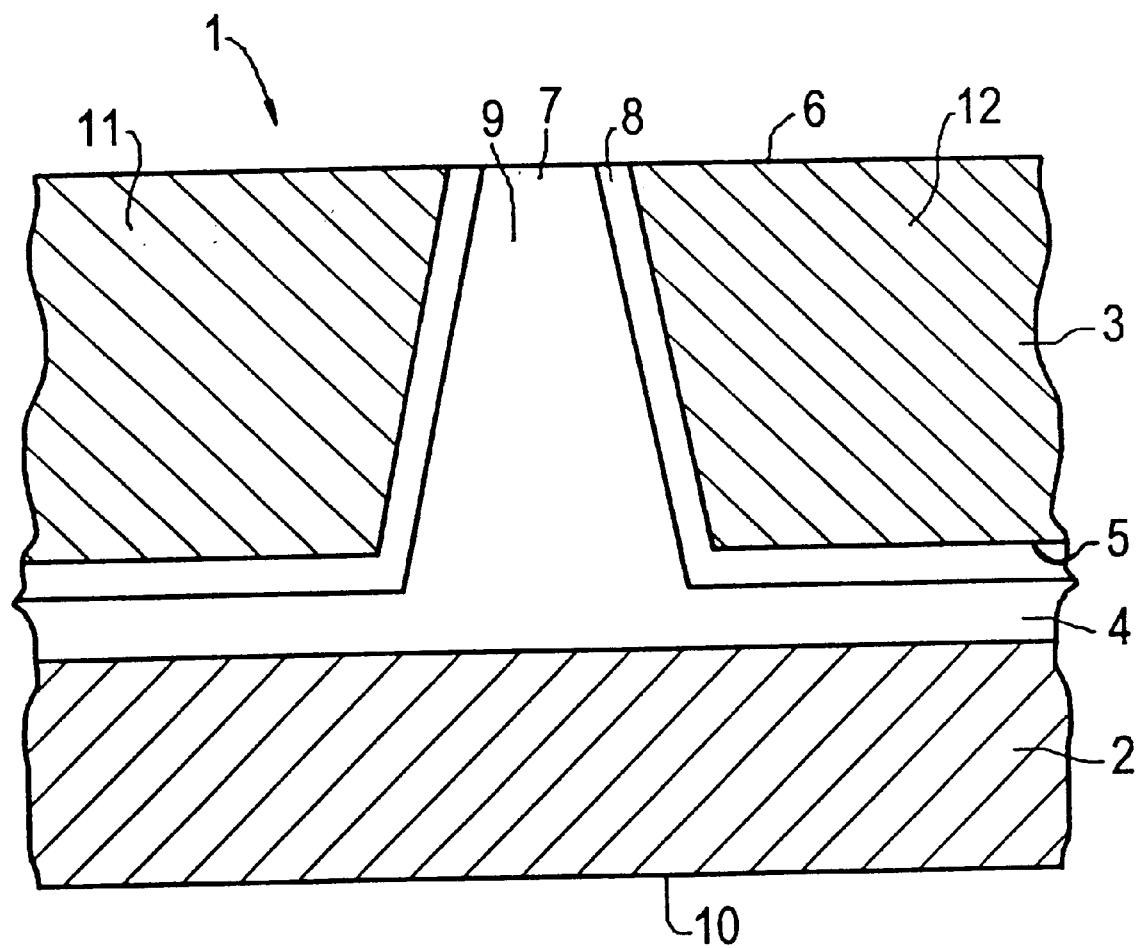

METHOD FOR FABRICATING DIRECT WAFER BOND SI/SIO₂/SI SUBSTRATES

BACKGROUND OF THE INVENTION

1. Field of the Invention

The invention relates to a method for fabricating direct wafer bond Si/SiO$_2$/Si substrates.

The direct wafer bonding technique is based on a two-stage process in which the oxidized surfaces of two silicon wafers, a so-called handle (carrier) wafer and a so-called device wafer, are firstly joined together at room temperature and cross-link in a subsequent heat-treatment step at 800 to 1100° C. The heat-treatment step serves to improve adhesion. A homogenous, fixedly adhering connection is achieved provided that the wafer surfaces are free of particles and mechanical defects.

The device wafer is then thinned to the desired layer thickness and the device wafer surface is polished. The layer uniformity of the wafer thickness and freedom from defects of the wafers prepared in this way depends on the quality of the starting material, the procedure in the course of the bonding itself and the method of thinning back.

Trenches are then etched into the device wafer surface. The etching time is in this case set such that the silicon of the device wafer is etched through as far as the bottom oxide. AS a rule, the bottom oxide is then slightly etched. In the worst case the bottom oxide is even etched away. The consequence of slight etching of the bottom oxide is that a reduction in the dielectric strength occurs due to the thinner layer thickness produced there.

After the etching of the insulation trenches, each individual insulation trench is filled with an oxide and polysilicon again. This produces "silicon islands" which are dielectrically insulated from one another. The "silicon islands" are dielectrically insulated from one another by the bottom oxide and the oxide fillings (connected to the bottom oxide) in the trenches.

SUMMARY OF THE INVENTION

It is accordingly an object of the invention to provide a method for fabricating direct wafer bond Si/SiO$_2$/Si substrates which overcomes the above-mentioned disadvantages of the prior art methods of this general type, which largely precludes the risk of slight etching of the bottom oxide or the risk of the bottom oxide being etched away.

With the foregoing and other objects in view there is provided, in accordance with the invention, a method for fabricating direct wafer bond Si/SiO$_2$/Si substrates, which includes: providing silicon wafers including a first silicon wafer serving as a carrier wafer and a second silicon wafer serving as a device wafer, the first silicon wafer and the second silicon wafer each having a front side and a rear side; etching trenches into the front side of the second silicon wafer; covering the trenches and the front side of the second silicon wafer with an insulation layer; subsequently forming a polysilicon layer by filling the trenches with polysilicon and covering the insulation layer on the front side of the second silicon wafer with the polysilicon; placing the front side of the second silicon wafer onto the front side of the first silicon wafer for joining the silicon wafers; heat-treating the joined silicon wafers; and thinning back the rear side of the second silicon wafer.

The method according to the invention has the advantage that the trench depth is no longer defined by the etching process, which is inaccurate and difficult to adjust, but rather by the thinning-back process, which can be precisely controlled. In particular, the method results in that the bottom oxide can no longer be slightly etched or etched away and therefore large material variations can no longer occur.

Furthermore, the method according to the invention makes it possible to achieve substantially greater packing densities of the silicon islands, since the etched trenches have a slightly V-shaped cross section. That is to say the trench walls are not parallel and the narrower side of the trenches is situated on the rear side of the device wafer and hence on the front side of the substrate.

In the present invention, not only are the trenches filled with polysilicon, but the entire front side of the device wafer is covered with polysilicon and the carrier wafer and the device wafer are connected to one another by the polysilicon layer. This has the advantage that the polylayer in the trenches can be put at ground or at the carrier wafer potential without further auxiliary devices.

In accordance with an added feature of the invention, there is the step of grinding and polishing the rear side of the second silicon wafer during the thinning back step.

In accordance with an additional feature of the invention, there is the step of producing a silicon oxide layer as the insulation layer on the trenches during the producing step.

In accordance with another feature of the invention, there is the step of extending the insulation layer entirely over the front side of the second silicon wafer during the covering step.

In accordance with a further added feature of the invention, there is the step of extending the polysilicon layer entirely over the insulation layer on the second silicon wafer during the forming step.

In accordance with a further additional feature of the invention, there is the step of oxidizing at least one of the first silicon wafer and the second silicon wafer prior to the placing step.

In accordance with yet another feature of the invention, there is the step of heating the joined silicon wafers to a temperature of between 800° C. and 1100° C. during the heat-treating step.

In accordance with a concomitant feature of the invention, there is the step of polishing and ground-planing the polysilicon layer before joining the first silicon wafer to the second silicon wafer.

Other features which are considered as characteristic for the invention are set forth in the appended claims.

Although the invention is illustrated and described herein as embodied in a method for fabricating direct wafer bond Si/SiO$_2$/Si substrates, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single figure of the drawing is a fragmentary, sectional view of a direct wafer bond Si/SiO$_2$/Si substrate which includes a first silicon wafer that serves as a carrier wafer, and a second silicon wafer that serves as a device wafer according to the invention.

DESCRIPTION OF THE PREFERRED EMBODIMENTS

Referring now to the single figure of the drawing in detail, there is shown a first silicon wafer 2 having a front side 4 and a rear side 10. A second silicon wafer 3 likewise has a front side 5 and a rear side 6. A trench 7 is etched into the front side 5 of the second silicon wafer 3. The trench 7 is covered with a silicon oxide layer 8. The silicon oxide layer 8 also extends over the entire front side 5 of the second silicon wafer 3. The trench 7 is filled with polysilicon 9 on top of the silicon oxide layer 8 in a manner free from shrink holes. The polysilicon 9 likewise extends from the trench 7 over the entire front side 5 of the second silicon wafer 3.

The second silicon wafer 3 is thinned back, that is to say ground and polished, on its rear side 6. The thinning back is carried out until the trench 7 is exposed.

After the thinning-back process, the second silicon wafer 3 processed in this way is placed by its front side 5 by way of the polysilicon layer 9 onto the front side 4 of the first silicon wafer 2. The joining together of the front side 4 and of the front side 5 of the two silicon wafers 2, 3 is carried out at room temperature.

The two boundary surfaces, that is to say the polysilicon layer 9 and the front side 4, composed of silicon, of the first silicon wafer 2 are then cross-linked with one another at a temperature of approximately 1000° C. In this case, particular care was taken to ensure that the two boundary surfaces to be cross-linked with one another are free of particles and mechanical defects.

After successful cross-linking, two silicon islands 11 and 12 which are dielectrically insulated from one another are formed in the direct wafer bond Si/SiO$_2$/Si substrate 1. Devices can subsequently be processed into the silicon islands 11 and 12. In this case, it is particularly advantageous for the resulting integrated circuits that the polysilicon layer 9, which extends from the trench 7 between the surface of the silicon oxide layer 8 and the front side 4 of the first silicon wafer 2, can automatically be put at ground potential or at the potential of the first silicon wafer 2.

We claim:

1. A method for fabricating direct wafer bond Si/SiO$_2$/Si substrates, which comprises:

providing silicon wafers including a first silicon wafer serving as a carrier wafer and a second silicon wafer serving as a device wafer, the first silicon wafer and the second silicon wafer each having a front side and a rear side;

etching trenches into the front side of the second silicon wafer;

covering the trenches and the front side of the second silicon wafer with an insulation layer;

subsequently forming a polysilicon layer by filling the trenches with polysilicon and covering the insulation layer on the front side of the second silicon wafer with the polysilicon;

placing the front side of the second silicon wafer onto the front side of the first silicon wafer for forming joined silicon wafers with the front side of the first silicon wafer in direct contact with the polysilicon;

heat-treating the joined silicon wafers; and thinning back the rear side of the second silicon wafer.

2. The method according to claim 1, which comprises grinding and polishing the rear side of the second silicon wafer during the thinning back step.

3. The method according to claim 1, which comprises producing a silicon oxide layer as the insulation layer on the trenches during the covering step.

4. The method according to claim 1, which comprises extending the insulation layer entirely over the front side of the second silicon wafer during the covering step.

5. The method according to claim 1, which comprises extending the polysilicon layer entirely over the insulation layer on the second silicon wafer during the forming step.

6. The method according to claim 1, which comprises oxidizing at least one of the first silicon wafer and the second silicon wafer prior to the placing step.

7. The method according to claim 1, which comprises heating the joined silicon wafers to a temperature of between 800° C. and 1100° C. during the heat-treating step.

8. The method according to claim 1, which comprises polishing and ground-planing the polysilicon layer before joining the first silicon wafer to the second silicon wafer.

* * * * *